United States Patent [19]

Rudy, Jr. et al.

[11] Patent Number: 4,836,789
[45] Date of Patent: Jun. 6, 1989

[54] ALIGNMENT SYSTEM FOR LINE REPLACEABLE MODULES

[75] Inventors: William J. Rudy, Jr., Annville; Howard R. Shaffer, Millersburg, both of Pa.

[73] Assignee: AMP Incorporated, Harrisburg, Pa.

[21] Appl. No.: 109,805

[22] Filed: Oct. 16, 1987

[51] Int. Cl.$^4$ .......................... H01R 13/64; H01R 9/09
[52] U.S. Cl. .......................................... 439/64; 211/41; 211/94; 439/377; 439/716
[58] Field of Search ................. 211/41, 94; 439/64, 439/377, 378, 196, 716, 629–631

[56] References Cited

U.S. PATENT DOCUMENTS

| | | | |
|---|---|---|---|
| 3,853,379 | 12/1974 | Goodman et al. | 439/377 |
| 3,869,185 | 4/1975 | Teagno | 339/65 |
| 4,046,443 | 9/1977 | Champagne | 439/377 |
| 4,134,631 | 1/1979 | Conrad et al. | 339/17 M |
| 4,164,362 | 8/1979 | Cobaugh et al. | 339/17 M |
| 4,243,283 | 1/1981 | McSparran | 439/64 |
| 4,470,100 | 9/1984 | Rebaudo et al. | 439/64 |
| 4,502,601 | 3/1985 | Husted et al. | 211/41 |
| 4,533,977 | 8/1985 | Koppensteiner | 361/415 |
| 4,619,490 | 10/1986 | Hawkings | 439/64 |
| 4,639,056 | 1/1987 | Lindeman et al. | 339/17 LC |
| 4,647,130 | 3/1987 | Blair et al. | 339/64 M |
| 4,689,721 | 8/1987 | Damerow et al. | 361/388 |
| 4,715,829 | 12/1987 | Preputnick | 439/660 |

FOREIGN PATENT DOCUMENTS 0758329 8/1980 U.S.S.R. ...................... 439/377
1438085 4/1974 United Kingdom .

OTHER PUBLICATIONS

IERC—Zif. Circuit Board Retainers.

*Primary Examiner*—Gil Weidenfeld
*Assistant Examiner*—P. Austen Bradley
*Attorney, Agent, or Firm*—Anton P. Ness

[57] ABSTRACT

A pair of track members is fastened to a framework of a black box forwardly of each mother board connector of an array thereof mounted on the mother board of the black box. The track members extend forwardly in parallel from end flanges of the connector to leading ends fastened to the black box framework at the LRM-receiving aperture, so that an LRM placed between the pair of tracks is movable to the mother board connector for mating of the LRM connector therewith. The trailing ends of the track members extend through precisely located holes through end flanges of the mother board connector and through the mother board after which the end portions are fastened to frame members behind the mother board. The track members can be hollow enabling fluid to be circulated therethrough to dissipate heat from the LRM. The track members can constitute the means to fasten the mother board connector to the mother board, and also the mother board to the framework of the black box.

6 Claims, 4 Drawing Sheets

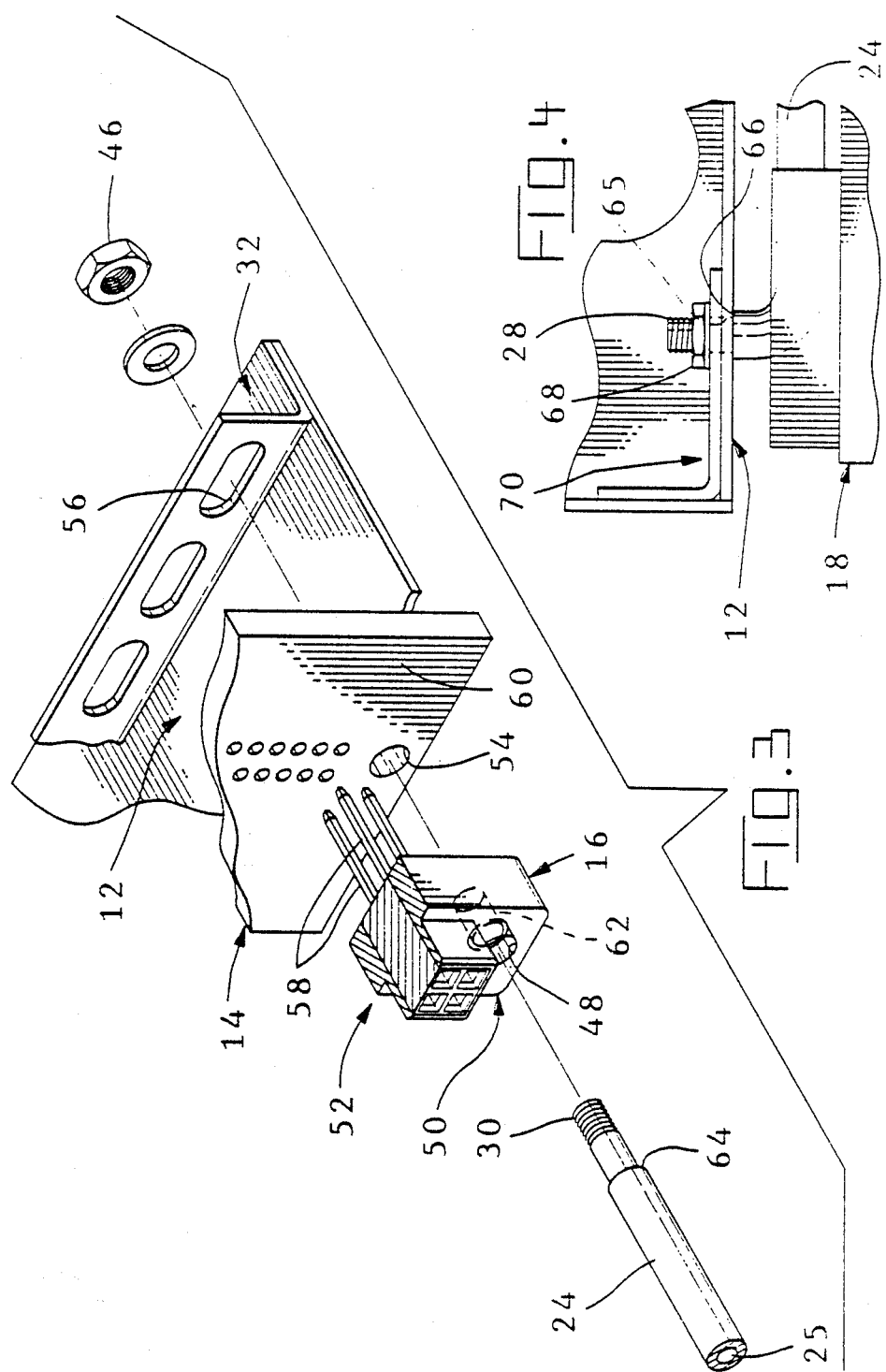

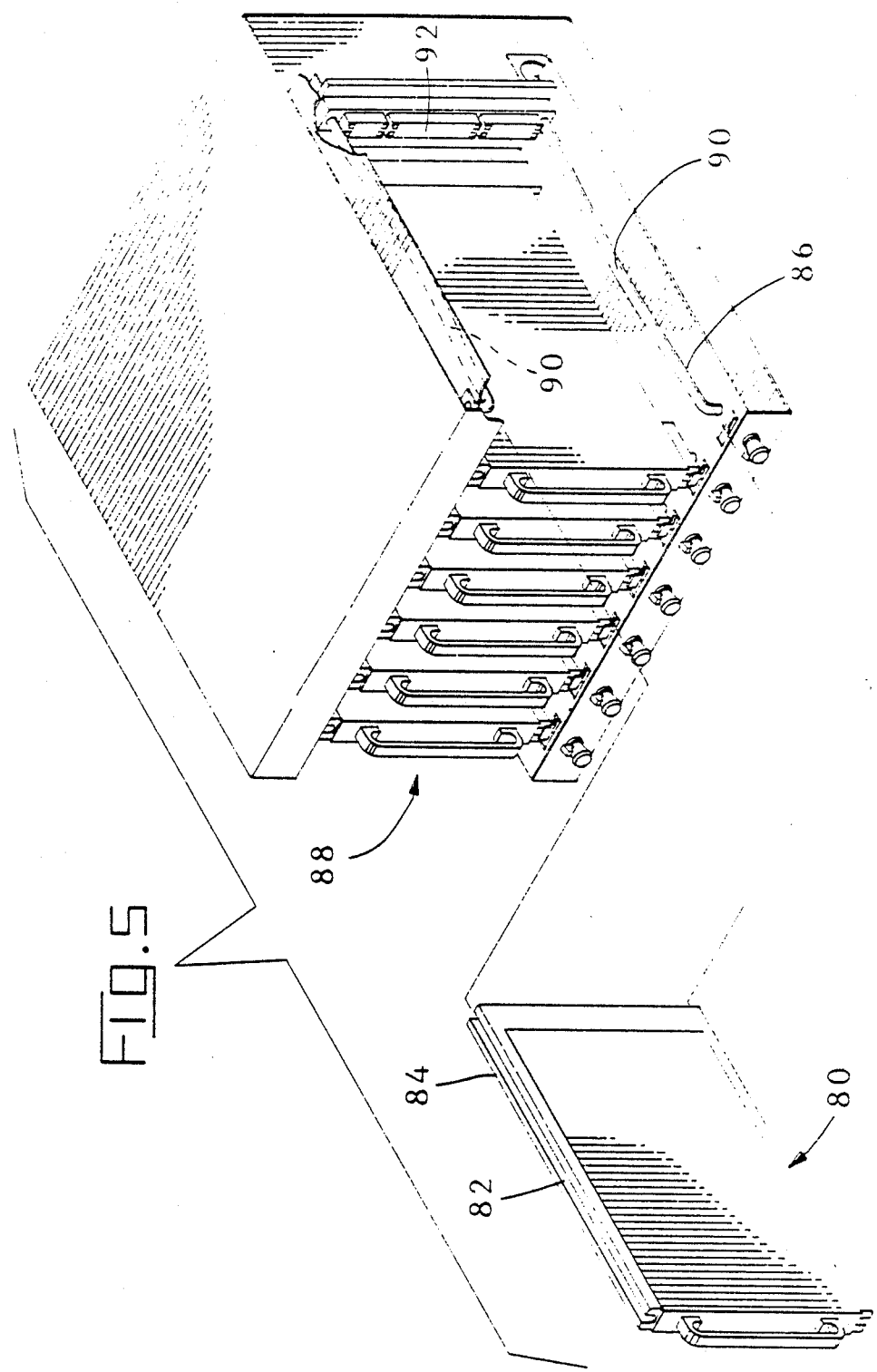

ALIGNMENT SYSTEM FOR LINE REPLACEABLE MODULES

FIELD OF THE INVENTION

The present invention relates to the mating of electrical connectors and more particularly to aligning of connectors for proper mating.

BACKGROUND OF THE INVENTION

Especially in the aircraft industry, it is becoming desirable that electronic control units, or "black boxes," each comprise a housing containing essentially a single circuit panel or mother board to which are electrically connectable a plurality of line replaceable modules on one surface and shipboard electrical systems on the other. Each line replaceable module, or LRM, performs a control or sensing or recording function and comprises essentially one or more circuit cards or daughter boards loaded with various electrical and electronic components, mounted to a heat sink plate and protected and shielded by cover plates, such as is disclosed in U.S. patent application Ser. No. 07/078,944 filed July 28, 1987 and assigned to the assignee hereof. The LRM is intended to be a durable, rugged assembly capable of being handled and repeatedly inserted into and removed from a black box for testing, repair, modification or replacement.

The plurality of LRMs are closely spaced in a side by side array within the black box and along the mother board; and each LRM has a small dimension along the array to facilitate such close spacing. The daughter card or cards and all of the electrical and electronic components connected thereto necessary in the LRM are secured to a heat sink plate disposed essentially along a plane transverse to the array of LRMs and extending rearwardly from the LRM connector at the forward end of the LRM, so that the LRM is long rearwardly and is wide transverse to the array. The electrical connector mounted on the forward end thereof has a mating face exposed to mate with the mating face of a corresponding one of a plurality of electrical connectors secured on the mother board mounted within the black box in a closely spaced array for efficient use of the real estate of the mother board. The black box must be provided with guiding means along opposing side walls extending from the LRM-receiving opening to each other board connector, to guide the long and wide LRM into lateral and axial alignment with the respective mother board connector for proper aligned mating of the connectors.

In one particular design of black box the guide means for each LRM comprises a pair of opposed channels formed in and along surfaces of plate members mounted along the side walls of the black box, and the cover plates of each LRM form a flange along each of its opposed side edges to be disposed in the guide channels therefor. The LRM flange is dimensioned just thin enough to permit movement along the channel without permitting side to side movement, for vibration resistance. Due to practical considerations the mother board with its precisely located circuitry cannot be mounted in the black box in such a way that its connectors are precisely aligned with the channels associated therewith which are already formed in the plate members of the black box. Therefore, the channel locations are not particularly precisely located with respect to the mother board connectors; the LRM flanges are constrained to move therealong which results in the LRM also being not particularly precisely aligned with the respective mother board connector. As a result, for this particular black box design either the mother board connector or the LRM connector must be capable of incremental lateral movement during mating to provide precise alignment of their terminals prior to terminal engagement.

Rack and panel or drawer connectors are known wherein one of a mating pair includes integral alignment posts extending forwardly therefrom to enter corresponding apertures of the other, for connector self-aligning during mating. At least one of the mating connectors is float mounted either on a panel or on framework or a panel at the leading end of the drawer by shoulder screws through enlarged diameter holes through connector flanges, enabling incremental lateral movement caused by bearing engagement of the alignment posts and apertures. Such a connector is the MET-RIMATE Drawer Connector (trademark of AMP Incorporated, Harrisburg, Pa.); another is disclosed in U.S. Pat. No. 4,647,130; and in both the connectors contain terminals terminated to discrete conductors. However, the float mounting means of the prior art drawer connectors is not particularly suitable for either the mother board connector or the LRM connector, which in turn means that the alignment post and aperture arrangement thereof also is not suitable for use with LRMs.

Mother board connectors in the black box must be fixedly mounted to the mother board to protect the terminations of those of its terminals which are soldered to circuit paths of the board, and the LRM connector must be secured well enough to and within the cover plates of the LRM to protect the terminations of those of its terminals which are soldered to circuit paths of daughter cards fixedly secured to heat sink plates within the LRM. Each mating pair of the plurality of electrical terminals of the connectors across their mating faces must be precisely aligned to establish respective electrical connections therebetween; the connectors may also have optical fiber connectors similarly requiring precise alignment for establishing optical connections. One type of high density connector which can be adapted for use in an LRM is diclosed in U.S. Pat. No. 4,715,829.

In U.S. patent application Ser. No. 07/078,944, the terminal housing means of the LRM connector is recessed within a shroud at the forward end of the LRM and is secured within the cover plates against axial movement but is permitted incremental lateral movement within a peripheral gap around the inside shroud surface. An alignment rib extends forwardly from the LRM connector housing means to enter a corresponding aperture in the mother board connector, and upon bearing engagement urges the LRM connector housing means incrementally laterally to align therewith.

It is desired to provide a guide means which is particularly precisely located and aligned with respect to the particular mother board connector with which the connector of an LRM is to mate, whereby the LRM is itself particularly precisely aligned with the mother board connector, and the connector housing of the LRM need not move incrementally within the LRM to align with the mother board connector, permitting an LRM of simpler construction and assembly.

SUMMARY OF THE INVENTION

According to the present invention, the guide means for each LRM comprises a pair of opposed tracks or rails secured to the framework of the black box and extending from the LRM-receiving opening thereof to the respective mother board connector mounting on the mother board secured within the black box. The LRM includes channel portions along opposed sides thereof within which the tracks are disposed enabling the LRM to follow the tracks during insertion into the black box. The end of each track at the mother board connector extends through a hole through an end flange of the connector, through a hole of the mother board aligned with the flange hole, and through a larger hole or slot of a frame member of the black box. The hole through the connector flange is precisely located with respect to the terminals thereof and is precisely dimensioned to just allow the track end to be inserted therethrough without allowing the track to move laterally therein.

The track is assembled to the black box by its connector end being inserted through the connector flange hole which precisely locates the track with respect to the connector, only after which is the connector end secured to the frame such as by a nut threaded onto the portion of the track end extending through the frame member. The other end of the track is secured at the LRM-receiving opening to a frame member of the black box, and can comprise a portion extending at a right angle outwardly to a stop shoulder and therepast through a hole of the frame member to a threaded end portion onto which a nut is secured. The stop shoulder engaging the inwardly facing surface of the frame member positions the track appropriately into the central portion of the black box to center the LRM. The track being as long as the LRM, any incremental angle with respect to the mother board connector caused by the other track end being secured in a frame member hole which is not very precisely located with respect to the mother board connector, is insignificant in its effect on axial alignment of the LRM and the LRM connector with the mother board connector.

According to another aspect of the present invention, the track can be a tube made of a metal alloy selected for its high heat conductivity and for spring characteristics. The track can be formed with a slight inward arcuate configuration along its length, so that during insertion of an LRM therealong the pair of tracks are deflected outwardly by the bottoms of the respective LRM channels and remain deflected applying spring bias against the channel bottoms assuring substantial surface contact therewith and thereby assuring a good thermal connection. The tubular tracks can be connected to a coolant system, and their tubular nature enables fluid to be pumped therethrough. This arrangement enables the tracks to participate in conducting heat away from the LRM during in-service use, and also can hold the sides of the LRM away from the black box framework to facilitate air flow therearound.

It is an objective of the present invention to provide a guide means for precisely aligning LRMs with corresponding mother board connectors during insertion into a black box, thereby eliminating the necessity of the LRM connectors to move incrementally to self-align with the respective mother board connectors.

It is another objective to provide a guide means which participates in removing heat from the LRM.

BRIEF DESCRIPTION OF THE DRAWINGS

FIG. 3 is an enlarged view of the connector end of a track exploded from the frame, the mother board, and the flange of the mother board connector, with a nut to be fastened on the end thereof upon assembly.

FIG. 4 is an enlarged view of the forward track end fastened to the framework.

FIG. 5 illustrates an alternate embodiment of the present invention with the tracks extending arcuately inwardly to engage continuous channel bottoms along the LRM under spring bias after LRM insertion.

DETAILED DESCRIPTION OF THE PREFERRED EMBODIMENT

Figure 1:
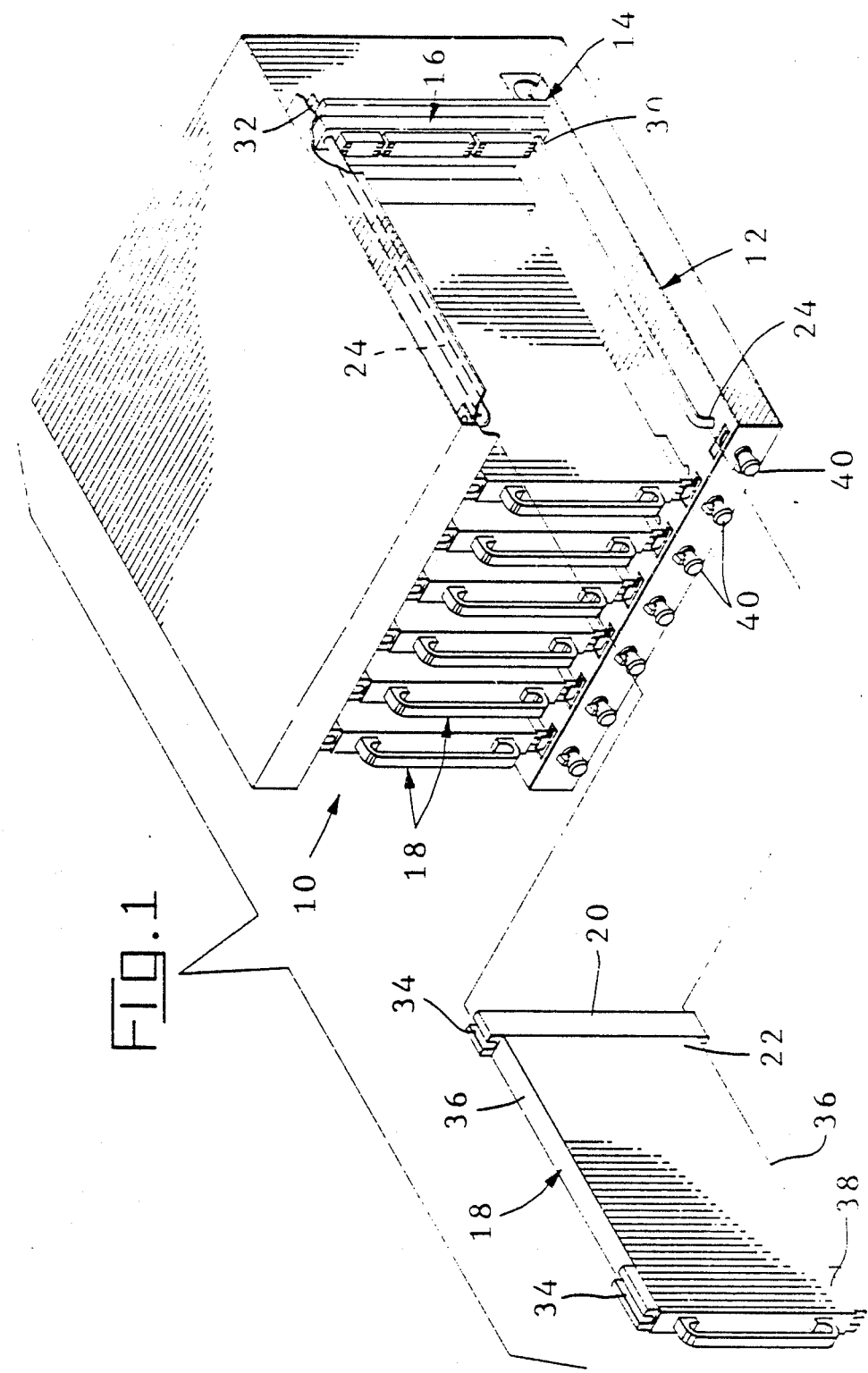
FIG. 1 is a perspective view of a black box having an array of LRMs therein, with one LRM removed therefrom showing the tracks of the present invention.

Black box 10 includes a frame 12 to which is mounted mother board 14 having an array of mother board connectors 16 mounted thereon side by side in a closely spaced array. A plurality of line replaceable modules or LRMs 18 are mounted in black box 10 likewise arranged in a closely spaced side by side array, with each LRM having an LRM connector 20 secured on a forward end 22 thereof in mated engagement with a respective mother board connector 16.

Figure 2:
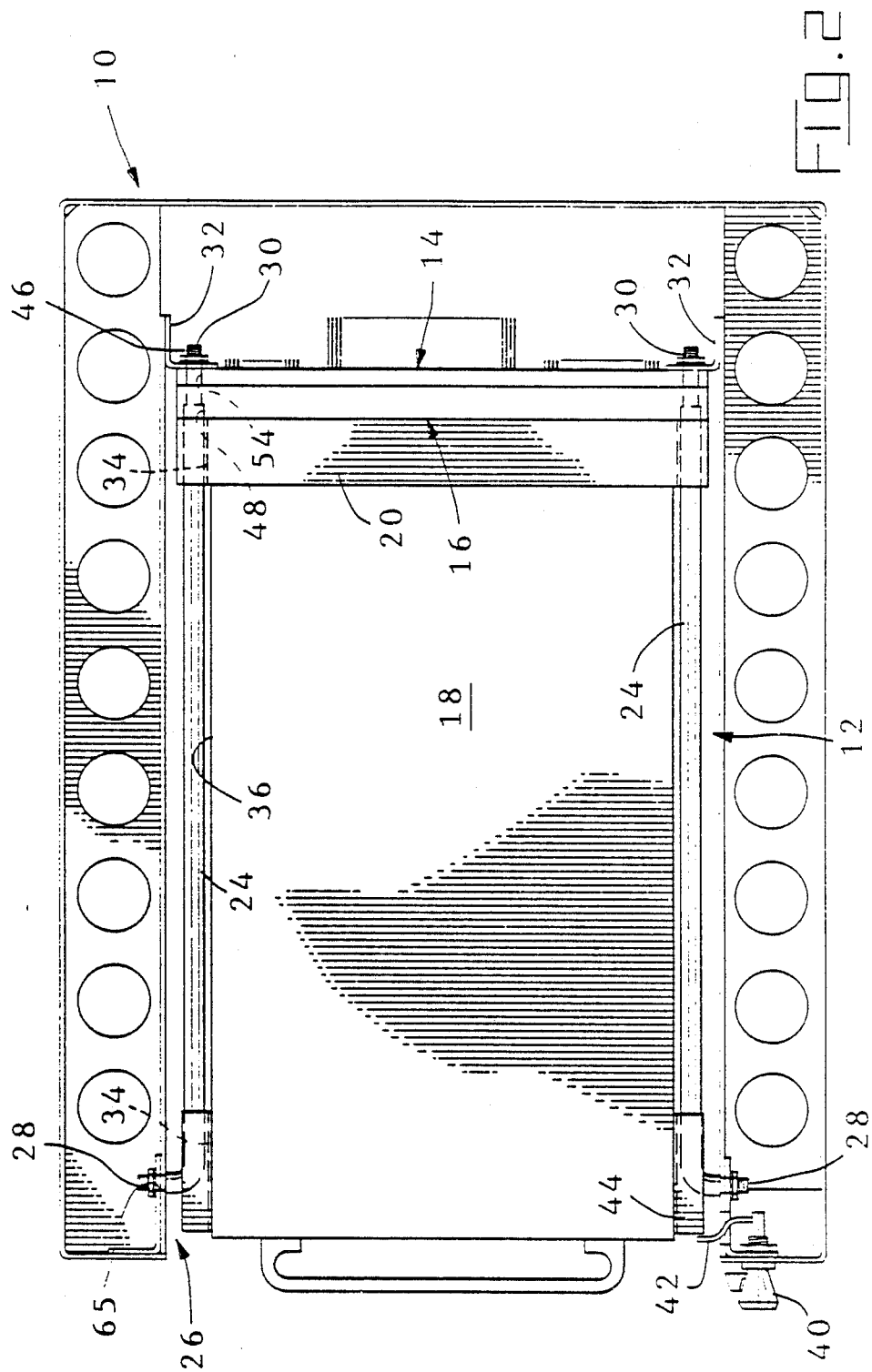
FIG. 2 is an elevation view of an LRM secured in position in the black box, with the tracks secured to the frame and shown in the LRM channels in phantom.

A pair of track members 24 extend forwardly from ends of each mother board connector 16 to the LRM-receiving opening 26 of black box 10 and are fastened at first ends 28 to frame 12 near opening 26 and at second ends 30 to a portion of frame 12 such as right angle members 32. Each LRM 18 includes channel portions 34 along sides 36 thereof at least at forward end 22 and at trailing end 38 along which tracks 24 are disposed enabling LRM 18 to be inserted into black box 10 therealong so that LRM connector 20 is laterally and axially aligned with corresponding mother board connector 16 upon full LRM insertion. A lock member 40 is then rotated into a position securing the LRM within the black box by means of a lock tab 42 being rotated behind an end portion 44 of LRM 18 as seen in FIG. 2.

With particular reference to FIG. 3, second end 30 of each track 24 is threaded to receive a nut 46 thereon to be fastened securely to frame member 32. Prior to nut 46 being placed thereon, second end 30 is inserted through hole 48 through flange 50 of metal shell 52 of mother board connector 16, through hole 54 of mother board 14, and through a large hole or slot 56 of frame member 32. Connector hole 48 is precisely located in connector flange 50 to correspond with the locations of terminals 58 along mating face 60 of the mother board connector, and is precisely dimensioned with respect to the diameter of track 24 so that track 24 may be inserted therethrough but not permitted lateral movement therewithin. Connector hole 48 may be counterbored to include a stop shoulder 62 cooperating with a stop shoulder 64 formed along second track end 30 at a precise distance from the right angle bend of first end 28, whereby when nut 46 is secured on end 30 the track firmly engages connector stop shoulder 62 and constitutes the primary mechanical means for holding mother board connector 16 to mother board 14. Prior to assembly of tracks 24, the mother board connectors are secured to mother board 14 by solder joints of their terminals 58 to board circuit paths or in through-holes of the board. Mother board hole 54 may be slightly larger than the portion of track end 30 extending therethrough and is aligned with connector hole 48. A slot 56 of frame member 32 is located at each connector location and extends in the direction of the array of mother board connectors, so that when mother board 14 is mounted to frame members 32 a portion of the slot is aligned with holes 48,54 to receive the threaded portion of track end 30 therethrough to be fastened with nut 46. In this embodiment tracks 24 when fastened provide the means for mounting the mother board connectors to the mother board, and further provide the means for mounting the mother board within the black box. It is easier to assemble the mother board with the array of connectors thereon, and the pairs of track members to the framework to comprise an assembly which is then placed into the outer cover of the black box and secured therein. Also it may be desirable for the back cover of the black box to be removable therefrom to enable access to the back surface of the mother board for repair thereof without first requiring removal of all LRMs and the framework from the black box to gain access to the mother board.

With particular reference to FIG. 4, first track end 28 is inserted into hole 65 to frame 12 until stop shoulder 66 engages frame 12 after which nut 68 is fastened onto the threaded end portion. Stop shoulder 66 is precisely located with respect to right angle bend 70 so that when seated against frame 12 the main track portion is parallel to the opposing track and perpendicular to mating face 60 of mother board connector 16, so that LRM 18 is axially aligned with connector 16.

An alternate embodiment of the present invention is shown in FIG. 5. LRM 80 includes continuous channels 82 along side surfaces 84 thereof. Track members 86 mounted in black box 88 have a slight inwardly arcuate configuration 90 beginning just above mother board connector 92. Upon insertion of LRM 80 therealong the bottom surfaces of channels 82 engage inward configurations 90 and deflect them outwardly. After LRM 80 is secured in black box 88, the spring characteristics of the deflected track portions provides continuous intimate contact with the bottom surfaces of channels 82 substantially their entire length, which establishes a good thermal connection between tracks 86 and LRM 80. Thus tracks 86 facilitate the dissipation of heat from the LRM during in-service use. This benefit can be enhanced by forming tracks 86 from tubing and coupling the ends thereof to a fluid circulation system (not shown) to enable cooling of the LRM by a conventional refrigerating system. Aluminum tubing could be used, with aluminum having good heat conductivity characteristics and enough spring strength to be useful in this embodiment.

While it is preferred that tracks be formed of cylindrical rods, or tubes (as shown in FIG. 3 at 25), other cross-sectional configurations could be used such as a V-shape with LRM channels being V-grooves. Other fastening means could be used to secure tracks to the black box framework. Still other variations may be made to the embodiments shown without departing from the spirit of the invention or the scope of the claims.

What is claimed is:

1. A guide system for modules enabling axial movement thereof towards a respective portion of a remote panel mounted in a framework, wherein an electrical connector mounted on a leading end of a module is to be mated with a corresponding electrical connector mounted on the remote panel to establish electrical connections between the respective electrical terminals thereof, said movement being in precise lateral and axial alignment therewith, comprising:

a remote panel affixed to a framework and including a first electrical connector disposed precisely located on a portion thereof, said first connector including a plurality of first electrical terminals therewithin;

a module insertable into said framework and movable toward said remote panel, said module including on a leading end thereof a second electrical connector associated with said first electrical connector and matable therewith, said second connector including a plurality of second electrical terminals therewithin associated with respective said first terminals and matable therewith; and a pair of opposed elongate track members each having a first end and a second end, both said first and second ends adapted to be fastened to said framework, said first end fastened to said framework forwardly of said panel portion and said second end inserted through a locating aperture of said panel portion and fastened to said framework therebehind, said first ends being fastened so that said pair of track members extend in parallel forwardly from said panel portion and perpendicular thereto;

said module having opposed side surfaces associated with said pair of track members and extending from a leading end to a trailing end of said module, each said side surface including channel portions therealong at least adjacent said leading end and said trailing end cooperating with a respective said track member, whereby said module is placeable between said track members with said track members disposed in close engagement with bottom surfaces of said channels and is movable along said pair of track members toward said panel portion and is laterally and axially aligned therewith upon being moved adjacent thereto; and said first connector includes flanges extending over said locating apertures and include holes precisely positioned with respect to locations of said first terminals in said first connector, and said holes aligned with said locating apertures through which said track members extend prior to being fastened to said framework thereby assuring that said second ends of said track members are disposed in a precise position with respect to said first terminals of said first connector, whereby said leading end of said module is aligned with said first connector upon being moved adjacent thereto, and said second connector is precisely aligned with said first connector at least immediately prior to mating enabling appropriate electrical engagement between said first and second terminals.

2. A guide system as set forth in claim 1 wherein said first end includes a portion extending outwardly from a right angle bend and further includes a stop shoulder engageable with a surface of the framework about an aperture through which the end portion of said first end extends to be fastened, whereby said track member is spaced a selected distance inwardly from said framework.

3. A guide system as set forth in claim 1 wherein said second end includes a stop shoulder engageable with a forwardly facing surface portion of said panel portion peripherally around said locating aperture therethrough through which said second end extends to be fastened to said framework, whereby said track members hold said panel portion to said framework.

4. A guide system as set forth in claim 1 wherein said track members are hollow tubes enabling fluid to be circulated therethrough to dissipate heat from said module during in-service use thereof in an electrical system.

5. A guide system as set forth in claim 1 wherein each of said pair of track members is slightly inwardly arcuate therealong and said track members are deflected outwardly by said bottoms of said channels of said module during insertion, and thereafter remain deflected and engage said channel bottoms under spring bias assuring substantial surface contact therewith and a good thermal connection therewith, facilitating heat dissipation from said module.

6. A guide system as set forth in claim 1 wherein said panel is a printed circuit board including a plurality of circuit means thereon to which said first terminals of said first connector are electrically connected.

* * * * *